(12) United States Patent
Basol

(10) Patent No.: US 8,187,904 B2
(45) Date of Patent: May 29, 2012

(54) METHODS OF FORMING THIN LAYERS OF PHOTOVOLTAIC ABSORBERS

(75) Inventor: Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 789 days.

(21) Appl. No.: 12/177,007

(22) Filed: Jul. 21, 2008

(65) Prior Publication Data

US 2010/0015754 A1    Jan. 21, 2010

(51) Int. Cl.
*H01L 21/00* (2006.01)
(52) U.S. Cl. ........... 438/57; 438/63; 438/84; 438/93; 438/95; 257/E21.09; 257/E31.127; 257/E31.129
(58) Field of Classification Search .......... None
See application file for complete search history.

(56) References Cited

U.S. PATENT DOCUMENTS

| | | | |
|---|---|---|---|
| 4,798,660 A | 1/1989 | Ermer et al. | |
| 6,048,442 A | 4/2000 | Kushiya et al. | |
| 7,259,106 B2 * | 8/2007 | Jain | 438/737 |
| 7,700,464 B2 * | 4/2010 | Robinson et al. | 438/502 |
| 7,732,229 B2 * | 6/2010 | Leidholm et al. | 438/22 |
| 7,858,151 B2 * | 12/2010 | Sager et al. | 427/255.34 |

OTHER PUBLICATIONS

Abedin, et al., "Electrodeposition of Selenium, Indium and Copper in an Air-and-water-Stable Ionic Liquid at Variable Temperatures", *Electrochimica Acta*, vol. 52, pp. 2746-2754, 2007.
Basol, et al., "Cu(In, Ga)Se2 Thin Films and Solar Cells Prepared by Selenization of Metallic Precursors", *J. Vacuum Sci. and Tech. A.*, vol. 14, pp. 2251-2256, 1996.
Calixto and Sebastian, "CuInSe2 Thin Films Formed by Selenization of CuIn Precursors", *J. Mat. Sci.*, vol. 33, pp. 339-345, 1998.
Chen, et al., "Cu/In Deposited at Room Temperature: Morphology, Phases and Reactions", *Solar Cells*, vol. 30, pp. 451-458, 1991.
Fritz and Chatziagorastou, "A New Electrochemical Method for Selenization of Stacked CuIn Layers in preparation of CuIn Se2 by Thermal Annealing", *Thin Solid Films*, vol. 247, pp. 129-133, 1994.
Kim, et al., "Preparation of CuInSe2 Thin films Using Electrodeposited In/Cu Metallic Layer", *Proc. Of 1st World Conf. on Photovoltaic Energy Conversion*, pp. 202-205, 1994.
Lockhande and Hodes, "Preparation of CuInSe2 and CuInS2 Films by Reactive Annealing in H2Se or H2S", *Solar Cells*, vol. 21, pp. 215-224, 1987.
Valderrama, et al., "Electrodeposition of Indium onto Mo/Cu for the Deposition of Cu(In,Ga)Se2 Thin Films", *Electrochimica Acta*, vol. 53, pp. 3714-3721, 2008.
Zank, et al., "Electrochemical Copeposition of Indium and Gallium for Chalcopyrite Solar Cells", *Thin Solid Films*, vol. 286, pp. 259-263, 1996.

* cited by examiner

*Primary Examiner* — Zandra Smith
*Assistant Examiner* — Khanh Duong
(74) *Attorney, Agent, or Firm* — Pillsbury Winthrop Shaw Pittman LLP

(57) ABSTRACT

A method and a system are provide for forming planar precursor structures which are subsequently converted into thin film solar cell absorber layers. A precursor structure is first formed on the front surface of the foil substrate and then planarized through application of force or pressure by a smooth surface to obtain a planar precursor structure. The precursor structure includes at least one of a Group IB material, Group IIIA material and Group VIA material. The planar precursor structures are reacted to form planar and compositionally uniform thin film absorber layers for solar cells.

42 Claims, 3 Drawing Sheets

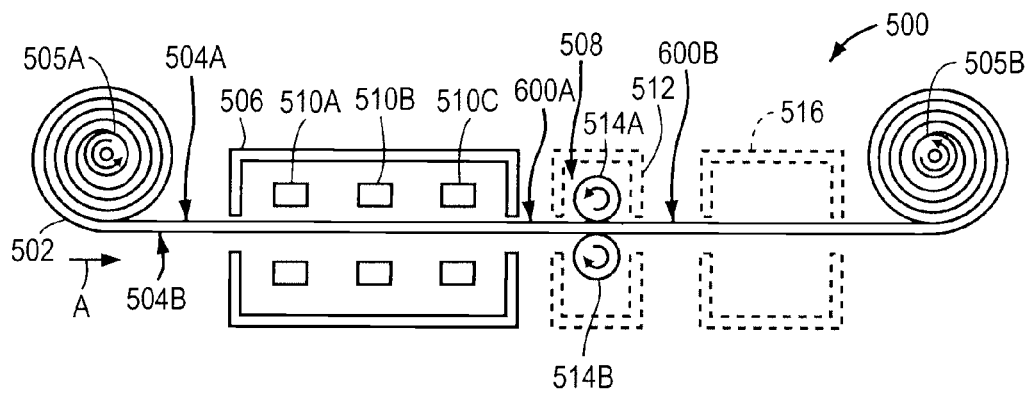
Figure 5
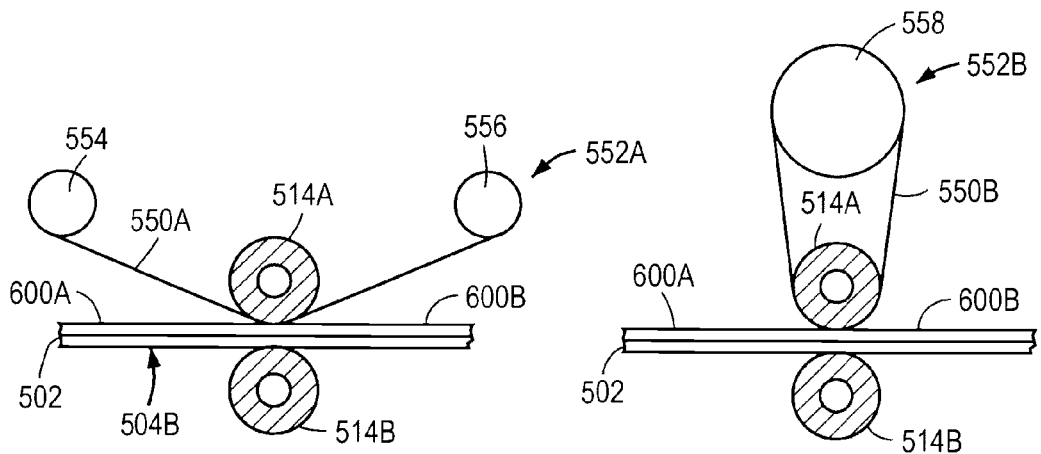
Figure 6A
Figure 6B
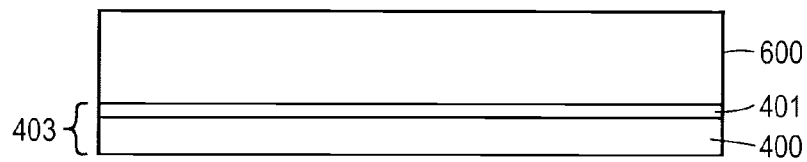
Figure 7

METHODS OF FORMING THIN LAYERS OF PHOTOVOLTAIC ABSORBERS

BACKGROUND

1. Field of the Invention

This invention relates to methods and apparatus to prepare good quality precursor films that are converted into solar cell absorbers.

2. Description of the Related Art

Solar cells are photovoltaic devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which includes a material in the family of $Cu(In,Ga,Al)(S,Se,Te)_2$, is grown over a conductive layer 13, which is previously deposited on the substrate 11 and which acts as the electrical contact to the device. Various conductive layers comprising Mo, Ta, W, Ti, and stainless steel etc. have been used in the solar cell structure of FIG. 1. If the substrate itself is a properly selected conductive material, it is possible not to use a conductive layer 13, since the substrate 11 may then be used as the ohimic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) or a grid pattern may also be deposited over the transparent layer 14 to reduce the effective series resistance of the device. A variety of materials, deposited by a variety of methods, can be used to provide the various layers of the device shown in FIG. 1. It should be noted that although the chemical formula for a CIGS(S) layer is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

One technique employed for growing $Cu(In,Ga)(S,Se)_2$ type compound thin films for solar cell applications is a two-stage process where at least two ingredients or elements or components of the $Cu(In,Ga)(S,Se)_2$ material are first deposited onto a substrate, and then reacted with S and/or Se in a high temperature annealing process. For example, for $CuInSe_2$ or CIS film growth, thin layers of Cu and In are first deposited on a substrate and then this stacked precursor structure is reacted with Se at elevated temperature to form CIS. If the reaction atmosphere also contains sulfur, then a CuIn(S,Se)$_2$ or CIS(S) layer can be grown. Addition of Ga in the precursor structure, i.e. use of a Cu/In/Ga stacked film precursor, allows the growth of a $Cu(In,Ga)(S,Se)_2$ or CIGS(S) absorber.

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. Electron beam evaporated In/Cu/Ga stacks have also been prepared and then reacted with $H_2Se$ to form CIGS (see, for example, B. Basol et al., J. Vacuum Science and Technology A, 14 (1996) 2251).

One prior art method described in U.S. Pat. No. 4,581,108 utilizes a low cost electrodeposition approach for metallic precursor preparation. In this method a Cu layer is first electrodeposited on a substrate. This is then followed by electrodeposition of an In layer and heating of the deposited Cu/In stack in a reactive atmosphere containing Se to form CIS. Various other researchers have reported In electroplating approaches for the purpose of obtaining In-containing precursor structures later to be converted into CIS absorber films through reaction with Se (see for example, Lokhande and Hodes, Solar Cells, 21 (1987) 215; Fritz and Chatziagorastou, Thin Solid Films, 247 (1994) 129; Kim et al, Proceedings of the 1$^{st}$ World Conf. on Photovoltaic Energy Conversion, 1994, p. 202; Calixto and Sebastian, J. Materials Science, 33 (1998) 339; Abedin et al., Electrochemica Acta, 52 (2007) 2746, and, Valderrama et al., Electrochemica Acta, 53 (2008) 3714).

In a thin film solar cell employing a Group IBIIIAVIA compound absorber such as CIS or CIGS, the solar cell efficiency is a strong function of the molar ratio of the IB element(s) to IIIA element(s), i.e. the IB/IIIA molar ratio. If there are more than one Group IIIA materials in the composition, the relative amounts or molar ratios of these IIIA elements also affect the solar cell efficiency and other properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at or below 1.0. For ratios higher than 1.0, a low resistance copper selenide phase, which may introduce electrical shorts within the solar cells may form. Increasing the Ga/(Ga+In) molar ratio, on the other hand, widens the optical bandgap of the absorber layer, resulting in increased open circuit voltage and decreased short circuit current. A CIGS material with a Ga/(Ga+In) molar ratio higher than about 0.3 is electronically poor. It is for this reason that the sunlight-to-electricity conversion efficiency of a CIGS type solar cell first increases as the Ga/(Ga+In) molar ratio in the absorber is increased from 0 to 0.3, and then the efficiency starts to decrease as the molar ratio is further increased towards 1.

In light of the above discussion, it should be appreciated that if any layer in a CIGS(S) precursor stack has non-uniform thickness, such non-uniformity produces micro-scale compositional non-uniformities. If, for example, the micro-structure of an In film or a In—Ga film electroplated on a planar Cu or Cu—Ga alloy layer is rough and includes protrusions and valleys or discontinuities, the localized micro-scale Ga/(In+Ga) ratio at the protrusions would be lower than the Ga/(In+Ga) ratio at the valleys. Furthermore, the Cu/(In+Ga) molar ratio would be different at these two locations. As will be described next, this kind of micro-scale non-uniformity would yield a CIGS(S) absorber with non-uniform electrical and optical properties after reaction of the precursor stack with Se and/or S.

Low melting Group IIIA materials such as In and Ga have high surface tension and they often grow in the form of islands or droplets when deposited on a substrate surface in thin film form. This behavior has been observed in prior work carried out on electroplated In films (see for example, Chen et al., Solar Cells, 30 (1991) 451; Kim et al, Proceedings of the 1$^{st}$ World Conf. on Photovoltaic Energy Conversion, 1994, p. 202; Calixto and Sebastian, J. Materials Science, 33 (1998) 339; Abedin et al., Electrochemica Acta, 52 (2007) 2746, and, Valderrama et al., Electrochemica Acta, 53 (2008) 3714), electroplated In—Ga alloy films (see for example Zank et al., Thin Solid Films, 286 (1996) 259) as well as in e-beam evaporated In films (Chen et al, Solar Cells, 30 (1991) 451). As stated before, lack of micro-scale planarity in In and/or Ga-rich layers presents problems for application of such non-uniform layers to thin film solar cell manufacturing.

FIGS. 2A-2B schematically show a prior art structure in perspective and side views, respectively. The structure includes a typical prior art In layer 37, with sub-micron thickness which may be electrodeposited on a surface 36 of an under-layer 33. The under-layer 33 is formed over a base 30 having a substrate 31 and a contact layer 32. The under-layer 33 may, for example, include Cu and Ga and be formed on the contact layer 32. As can be seen from FIGS. 2A and 2B, the sub-micron thick In layer 37 is discontinuous and it includes islands 34 of In, separated by valleys 35 through which the surface 36 of the under-layer 33 is exposed. The width of the islands may be in the range of 500-5000 nm. Although the top surface of the islands in FIG. 2B is shown as relatively planar, in practice the heights of the individual islands may be different from each other and their top surfaces may be irregular instead of flat (see for example FIG. 4A). In any case, if the structure of FIGS. 2A and 2B is reacted with a Group VIA material such as Se, a CIGS solar cell absorber 40 may be formed on the base 30 as shown in FIG. 3. The CIGS solar cell absorber 40 has compositional non-uniformities caused by the morphological non-uniformity of the sub-micron thick In layer 37. Accordingly, the CIGS solar cell absorber 40 has a first region 41 and a second region 42. The first region 41 corresponds to the islands 34 of In of the structure of FIG. 2A, and is an In-rich, Ga-poor region. The second region 42 corresponds to the valleys 35 of the structure of FIG. 2A, and is an In-poor, Ga-rich region. Furthermore, the Cu(In+Ga) molar ratio in the first region 41 is lower than the Cu(In+Ga) molar ratio in the second region 42. It should be appreciated that when a solar cell is fabricated on the CIGS solar cell absorber 40, the efficiency of the solar cell would be determined by both the first region 41 and the second region 42. The solar cell would act like two separate solar cells, one made on the first region 41 and the other made on the second region 42 and then interconnected in parallel. Since the Ga/(Ga+In) as well as the Cu/(In+Ga) molar ratios in the two regions are widely different the quality of the separate solar cells on these regions would also be different. The quality of the overall solar cell would then suffer from the poor I-V characteristics of the separate solar cells formed on either one of the first and second regions.

As can be seen from the foregoing discussion there is a need to develop approaches that provide substantially planar precursor structures that can be converted into compositionally uniform semiconductor films. Such films can be used in electronic applications such as in processing thin film CIGS type solar cells.

SUMMARY OF THE INVENTION

The present invention relates to methods and apparatus to prepare good quality precursor films that are converted into solar cell absorbers.

In one aspect, the present invention provides a method of forming a Group IBIIIAVIA compound layer for thin film solar cell fabrication, the method comprising providing a base having a front surface and a back surface; depositing at least one layer of a precursor structure over the front surface of the base, wherein the precursor structure includes at least one of a Group IB material, a Group IIIA material and a Group VIA material; planarizing the at least one layer of the precursor structure by pressing a smooth surface onto the at least one layer of the precursor structure thus forming a planarized precursor structure. In a particular aspect, among others, there is further provided a step of reacting to form the Group IBIIIAVIA compound layer on the base, wherein the step of reacting comprises applying a heat in the range of 350-600° C. to the planarized precursor structure.

In another aspect, the present invention provides a method of manufacturing precursor stacks used for solar cell absorber fabrication, the method comprising providing a flexible base having a front surface and a back surface; coating a Group IIIA material layer over the front surface of the flexible base, wherein the Group IIIA material comprises one of Ga, In and Ga—In alloy; and planarizing the Group IIIA material layer by pressing a smooth surface over it thus forming a planarized Group IIIA material layer. In a particular aspect, among others, there is further provided heating the Group IIIA material layer to a temperature during the step of planarizing wherein the temperature is lower than or equal to 156° C.

In a further aspect, there is provided a system for forming precursor structures for manufacturing solar cells over a workpiece, the workpiece including a substrate having a front surface and a back surface, the system comprising: a process station including at least one material deposition unit to deposit at least one layer of a precursor structure comprising at least one of a Group IB material, a Group IIIA material and a Group VIA material over the front surface of the substrate; a moving mechanism for supplying the workpiece into the process station; and at least one planarization apparatus having a smooth surface that is adapted to planarize the at least one layer of the precursor structure by applying pressure to the at least the one layer of the precursor structure. In a particular aspect, among others, the workpiece is a continuous flexible workpiece and the substrate is a continuous substrate, and the moving mechanism is adapted to supply the continuous flexible workpiece into the process station.

These and other aspects and advantages, among others, are described further hereinbelow.

BRIEF DESCRIPTION OF THE DRAWINGS

FIG. 5 shows an exemplary system to carry out an embodiment of the invention.

FIGS. 6A-6B shows alternative planarization means to use with the system shown in FIG. 5.

FIG. 7 is a schematic cross-sectional view of a CIGS layer formed after reaction of a precursor structure planarized in accordance to the present invention.

DETAILED DESCRIPTION OF THE INVENTION

The present invention provides a method for forming a high quality Group IBIIIAVIA semiconductor layer on a base that can be used for thin film solar cell fabrication. Accordingly, the method forms a precursor structure on the base, the precursor structure comprising at least one Group IB material and at least one Group IIIA material, preferably in substantially unreacted metallic form. The precursor structure may additionally contain a Group VIA material, and may also contain a plurality of different layers, as explained hereinafter, and as such it is understood that that the phrase "precursor structure" can contain a single layer or a plurality of layers. The precursor structure or any or all of the layers within the precursor structure is subjected to a planarization step to form a planarized precursor structure. After the planarization step there may be additional process steps to deposit other ingredients over the planarized precursor structure to form a final precursor film. In some cases there is no need for additional process steps after the planarization step, i.e. the planarization is applied to the completed precursor structure to form the final precursor film, which, in this case is a planarized precursor structure. The final precursor film or the planarized precursor structure is subjected to a high temperature process, typically at a maximum temperature range of 400-600° C. and preferably in presence of a Group VIA material to convert it into a Group IBIIIAVIA compound layer. The method and apparatus of the present invention will now be described by taking as an example the formation of a Cu(In,Ga)Se$_2$ or CIGS solar cell absorber on a base. It will be appreciated that the invention is also applicable to the formation of other Group IBIIIAVIA compound films comprising other Group IB materials such as Ag, other Group IIIA materials such as Al and Tl, and other Group VIA materials such as S and Te. It should be noted that the base over which the precursor structure is formed may include a rigid or a flexible substrate. In an embodiment where the base includes a flexible substrate and a contact layer thereover, the combination of the base and a precursor structure formed over the contact layer can be together referred to as a flexible stack.

Figure 1:
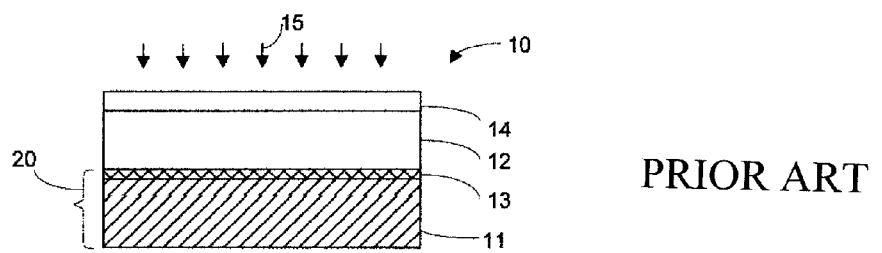
FIG. 1 is a schematic view of a prior art solar cell structure.
Figure 2A:
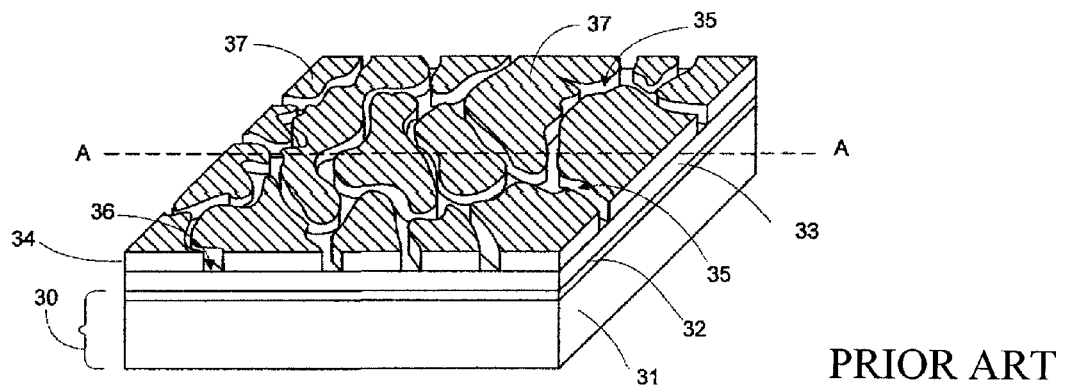
FIG. 2A is a perspective top view of a prior art precursor structure formed by electroplating a sub-micron thick In layer on a sub-layer.
Figure 2B:
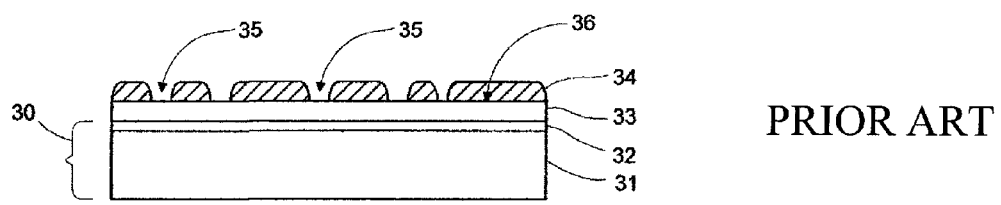
FIG. 2B is a cross-sectional view of the structure of FIG. 2A taken along the line AA.
Figure 3:
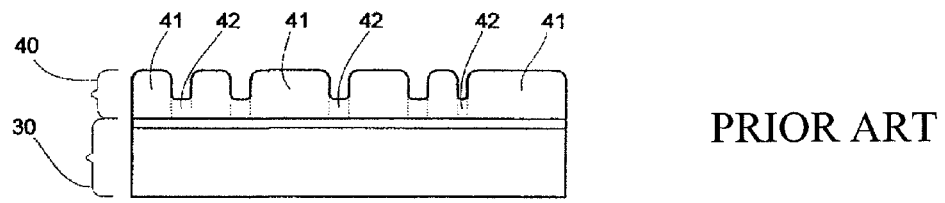
FIG. 3 is a CIGS layer formed after reaction of the structure of FIG. 2B with Se.
Figure 4A:
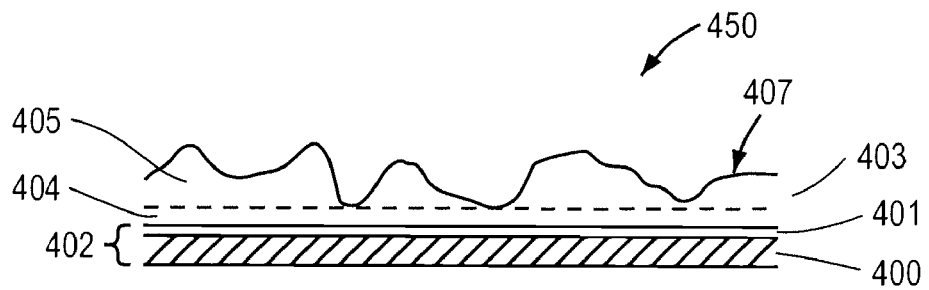
FIG. 4A shows a precursor structure on a base, with the precursor structure having a non-planar surface.

FIG. 4A shows an exemplary structure 450 including a type I precursor structure 403 deposited over a base 402. Type I precursor structure in this example is a substantially metallic layer. Out of the constituent elements of a Group IBIIIAVIA compound, the Group IB materials (such as Cu) and the Group IIIA materials (such as In and Ga) are metals. The Group VIA materials, on the other hand are either semi-metals (such as Se and Te) or non-metals (such as S). Therefore, the type I precursor structure which is substantially metallic, comprises Group IB and Group IIIA metals as will be discussed next. Any other materials that may be present in the type I precursor structure are present in amounts less than about 10 molar percent, preferably less than about 5 molar percent.

The base 402 may comprise a substrate 400 and an optional contact layer 401. The substrate 400 may be a metallic or polymeric substrate, preferably a 25-75 micrometer thick flexible metallic foil such as a stainless steel foil or an aluminum alloy foil or a high temperature flexible polymeric material foil such as an electrically insulating polyimide web. The contact layer 401 is a conductive layer comprising a material that makes ohmic contact to Group IBIIIAVIA compounds. Such materials include but are not limited to Mo, W, Ta, and their nitrides and materials such as Ru, Ir, Os.

The type I precursor structure 403 deposited or formed over the contact layer 401 includes at least Cu and one of In and Ga. Preferably the type I precursor stricture 403 includes all of Cu, In and Ga. For example, the type I precursor structure 403 may comprise a stack of a Cu-rich layer 404, which is shown by dotted lines, and an In and/or Ga rich layer 405. Various techniques may be used to deposit the type I precursor structure 403 on the base 402. Such techniques include but are not limited to evaporation, sputtering, ink deposition and electrodeposition. The preferred technique is electrodeposition. It should be noted that the nature of the type I precursor structure 403 may be changed widely. For example the type I precursor structure 403 may be a single Cu—In—Ga layer, or a stack of multiple layers such as a Cu/In/Ga stack, a Cu/Ga/In stack, a Cu—In/Ga stack, a Cu—Ga/In stack, a Cu/In—Ga stack and the like, where Cu—In, Cu—Ga, In—Ga and Cu—In—Ga refer to mixtures or alloys of Cu and In, Cu and Ga, In and Ga and Cu and In and Ga, respectively. As shown in FIG. 4A the top surface 407 of the type I precursor structure 403 is rough, i.e. non-planar. The average thickness of an exemplary type I precursor structure may be in the range of 400-1000 nm, preferably in the range of 500-800 nm. As depicted in FIG. 4A the Cu-rich layer 404 is relatively easy to deposit in a planar manner. Evaporation, sputtering, electroplating are examples of techniques that yield smooth Cu rich layers, such as pure Cu layers, with small grains and smooth surface. Indium and/or Ga rich layers, such as pure In or Ga layers or In—Ga alloy layers on the other hand, are more difficult to obtain in a planar manner as discussed before. A Group VIA material such as Se and a dopant such as Na may also be included in the type I precursor structure. This inclusion may be achieved in the form of nano size particles or through partial reaction with any of Cu, In and Ga with The Group VIA material and/or the dopant. But, as stated before, such inclusion is limited to at most 10 molar percent, preferably less than 5 molar percent.

Figure 4B:
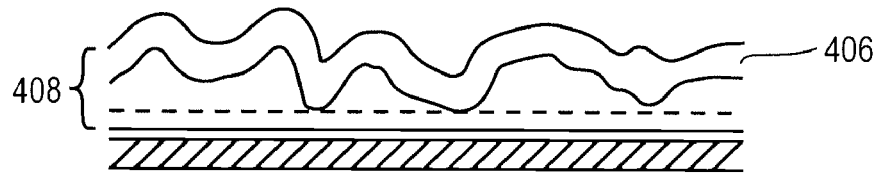
FIG. 4B shows another precursor structure having a non-planar surface.

FIG. 4B shows an exemplary precursor structure referred to as a type II precursor structure 408 that includes a Group VIA-rich material portion such as a Se-rich layer 406. The type II precursor structure 408 may, for example, be obtained by depositing a Se film over the type I precursor structure 403 of FIG. 4A.

Figure 4C:
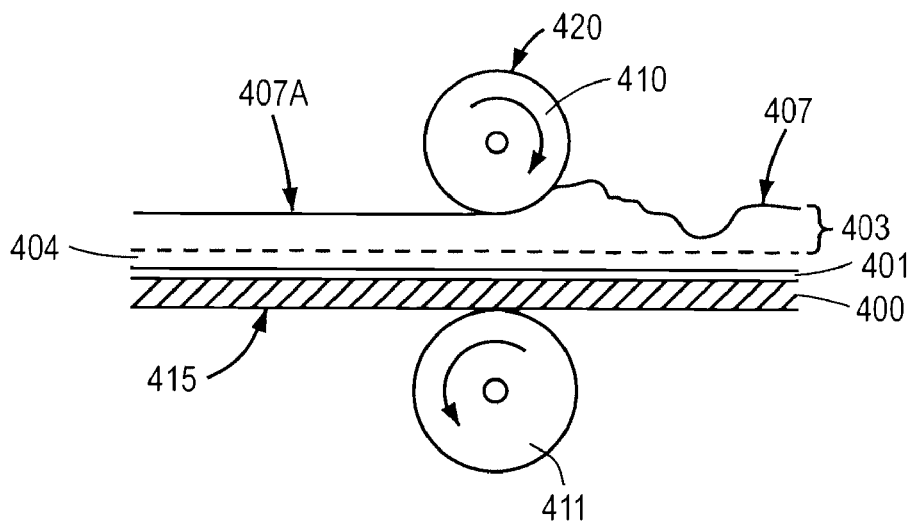
FIG. 4C shows the planarization of the precursor structure of FIG. 4A.

FIG. 4C shows the planarization process carried out on the precursor structure of FIG. 4A, i.e. the type I precursor structure 403. As can be seen from this figure, planarization is achieved by applying pressure to the top surface 407 of the type I precursor structure 403, preferably using rollers. Although the preferred method is to use two rollers, an upper roller 410 and a lower roller 411 as shown in the figure, it is also possible to support the bottom surface 415 of the substrate 400 on a flat surface (not shown) or a support structure and to use only the upper roller 410 for planarization of the type I precursor structure 403. As the upper roller 410 rolls over the top surface 407 of the type I precursor structure 403 it flattens it yielding a planarized type I precursor structure with a planar surface 407A. The surface 420 of the upper roller 410 is mirror finished, preferably to an average surface roughness of less than or equal to 50 nm, more preferably to less than or equal to 20 nm to yield a mirror finished planar surface 407A. It should be noted that there are other means of achieving planarization also. In one approach, for example, a flexible flat sheet (not shown) may be placed over the top surface 407 of the type I precursor structure 403. The force by the upper roller 410 may then be applied to the flat sheet which, in turn, is pushed on the top surface 407 of the type I precursor structure 403, flattening it. In this case the surface quality of the upper roller 410 may not be as important. Instead, the average roughness value of the surface of the flat sheet facing the top surface 407 of the type I precursor structure 403 needs to be less than or equal to 50 nm, preferably less than or equal to 20 nm. There are many polymeric sheets which can be used as the flat sheet. These include but are not limited to Mylar sheets, Teflon-based sheets, polyimide-based sheets, high density polyethylene sheets, polypropylene sheets, polycarbonate sheets, etc. The flat sheet may have a thickness range of 25-150 micrometers. In addition to inserting the flat sheet between the surface 420 of the upper roller 410 and the top surface 407 of the type I precursor structure 403, a second flat sheet may also be inserted between the lower roller 411 and the bottom surface 415 of the substrate 400. This way the forces applied by the upper roller 410 and the lower roller 411 are cushioned by the flat sheet and the second flat sheet, and more uniformly applied to the type I precursor structure 403. Such planarization or flattening methods may be applied in a roll-to-roll manner to substrates and precursor structures which may be in the form of long and flexible web.

It should be noted that the presence of In and Ga in metallic form within the type I precursor structure 403 facilitates the planarization process since these materials are pliable or malleable and therefore they may be efficiently flattened. During flattening, the high peaks of the type I precursor structure 403 get pushed down by the force of the rollers and the material slips horizontally to fill in the valleys in the type I precursor structure 403.

The planarization process may be carried out at room temperature or at an elevated temperature. Force applied from the upper roller 410 onto the top surface 407 may be in the range of a few kilograms to a few tons. Preferably, the force applied (per 10 cm section) may be in the range of 100-1000 kg. As the temperature of the process during planarization is increased from room temperature towards the melting temperature of In, which is about 156° C., the applied force may be reduced since the type I precursor structure 403 becomes softer. A preferred range of process temperatures for the planarization step is 20-150° C. The heat may be applied to the process by various means such as heating the substrate or heating the roll(s), or both, however, the preferred method is to use heated rollers for this purpose. Another method is to carry out the rolling process in flowing heated water to soften the type I precursor structure 403 and at the same time to keep its top surface as well as the surface 420 of the upper roller 410 clean and free from particles, which, if present would introduce defects into the type I precursor structure 403 during planarization, mostly in the form of embedded particles. As explained before, the rollers, especially the upper roller 410 should have a smooth surface. The average roughness of the roller surface 420 may be less than 50 nm, preferably less than 20 nm to yield a substantially defect free planar surface 407A. The rollers may be made of various materials including metals, rubbers, plastics, glass and ceramics. The surface of the rollers may be coated with a release layer that does not allow sticking of In and Ga to the surface of the roller. In other words the adhesion strength of the precursor structure materials to the contact layer 401 needs to be higher than their adhesion strength to the roller surface 420.

Figure 4D:
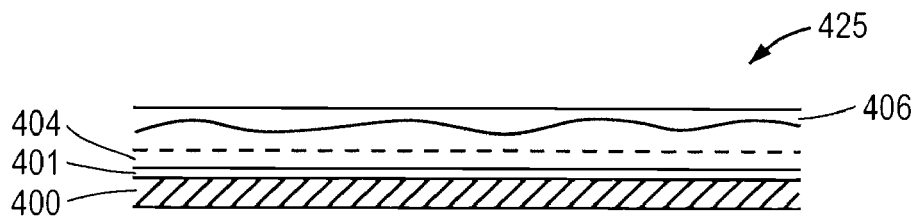
FIG. 4D shows the planarization of the precursor structure of FIG. 4B.

FIG. 4D shows the planarized type II precursor structure 425 which is obtained after planarization of the type II precursor structure 408 depicted in FIG. 4B. In this case the Se-containing layer 406 is pressed into the underlying metallic film and flattens it. Carrying out the rolling and planarization step at a temperature in the range of 50-200° C. may also cause crystallization of the Se-containing layer and some chemical mixing between the Se-containing layer and the underlying metallic film. This may improve the quality of the CIGS layer obtained from the planarized type II precursor structure. All aspects of the invention explained in relation to FIGS. 4A and 4C and in relation to the planarization of the type I precursor structure 403 are also applicable to the type II precursor structure 408 of FIG. 4B and the planarized type II precursor structure 425 depicted in FIG. 4D. These details will not be repeated here.

FIG. 5 shows a roll-to-roll or reel-to-reel system 500 of the present invention to perform the process of the present invention on a continuous flexible workpiece 502. The continuous workpiece 502 may comprise a base including a flexible substrate, such as a metallic foil or a polymeric foil, and a contact layer formed on a front surface of the substrate. In the roll to roll processes of the present invention, the above described planarized precursor structures may be formed over the front surface 504A of the continuous workpiece 502 as the continuous workpiece is advanced through the system 500 by a moving mechanism (not shown). Alternately, as a precursor structure is formed using the system 500, one or more of the layers within the precursor structure may be planarized. During the process, the moving mechanism feeds the continuous workpiece 502 into the system in the direction of arrow 'A' from a supply spool 505A. The processed continuous flexible workpiece is taken up and wrapped around a receiving spool 505B. In one embodiment, the system 500 comprises at least a process station 506 and at least one planarization apparatus 508.

The process station 506 may include one or more deposition units, such as deposition units 510A, 510B and 510C to form a precursor structure 600A. The deposited precursor structure on the surface 504A of the continuous workpiece 502 may be the same as the precursor structures shown in FIGS. 4A or 4B. For clarity, in FIG. 5, the deposited precursor structure is denoted with the reference numeral 600A which points at a portion of the continuous workpiece 502. In this configuration, for example, a Group IB material such as Cu may be deposited in the deposition unit 510A; a Group IIIA material such as Ga and/or In may be deposited in the deposition unit 510B; and a Group VIA material such as Se may be deposited in the deposition unit 510C. The system 500 may have more than one planarization apparatus 508. The exemplary configuration shown in FIG. 5 forms a precursor structure using the deposition units 510A, 510B and 510C, and planarizes the precursor structure using the planarization apparatus 508 to form a planarized precursor structure. It should be noted that the planarization apparatus 508 may be placed in the process station 506 to planarize any of the layers deposited in any of the deposition units. Alternately, more than one planarization apparatus may be employed to planarize more than one layer deposited in the deposition units. For example, the system 500 may include two planarization apparatus. One planarization apparatus may be employed after the deposition unit 510B to planarize the layer of the Group IIIA material deposited in the deposition unit 510B, and another planarization apparatus may be employed after the deposition unit 510C to planarize the fully formed "Group IB material/planarized Group IIIA material/Group VIA material" stack to form a planarized precursor structure. In another example, the planarization apparatus may be employed only after the deposition unit 510B. In this case, a Group IB material layer is deposited in deposition unit 510A, a Group IIIA material layer is deposited in deposition unit 510B, a planarization step is carried out using the planarization apparatus, and then a Group VIA material layer is deposited on the planarized Group IIIA material layer forming the final precursor film, which we also call a planarized precursor structure. It should be noted that we refer to a precursor structure as "planarized precursor structure" if one or more layers within that structure is planarized in accordance with the teachings of this invention. For example, a Cu/In/Se stack or precursor structure would be called a planarized precursor structure if a planarization step is carried out; i) only after the Cu deposition step, ii) only after the In deposition step, iii) only after the Se deposition step, iv) both after the Cu deposition step and the In deposition step, v) both after the In deposition step and the Se deposition step, vi) both after the Cu deposition step and the Se deposition step, vii) after every deposition step, i.e. after the Cu deposition step, after the In deposition step and after the Se deposition step.

The planarization apparatus 508 may include one or more planarization means such as smooth surfaces that flattens the precursor structure 600A or any of its layers when pressed on it. In FIG. 5, planarized or flat precursor structure is denoted with the reference number 600B. In this respect the smooth surface may be one of a flat surface of a plate that may be pressed onto the precursor structure 600A, a surface of a roller that may be pressed and rolled on the precursor structure 600A or a surface of a sheet material pressed on the precursor structure 600A. As described in the above description, in one embodiment, smooth surfaces are the surfaces of rollers that are pressed onto the precursor structure 600A. In this embodiment, as an example and to show the order of the process steps, the planarization apparatus 508 is located after the process station 506 so that after the precursor structure 600A is formed, it is planarized by the planarization apparatus as the workpiece is moved in the direction of the arrow A. However, as explained above, a number of planarization apparatuses may be placed after the selected or all deposition units in the process station 506 to planarize the selected or all of the deposited layers of the precursor structure 600A, which may be in the form of a multi-layer stack. In one embodiment, the planarization apparatus 508 may be placed in a cleaning station 512 so that a cleaning fluid, such as DI water, is used to clean the deposited and or planarized layers thus provide a particle free environment to the planarization process. As explained above, this reduces defectivity in the planarized precursor structure. One or more cleaning units with or without the planarization apparatus 508 may be placed into the process station 506 after the selected or all of the deposition units.

The planarization apparatus may be heated by a heating system (not shown) to apply heat to the precursor structure or to any of its layers as it is planarized. The same may be achieved by heating the cleaning fluid in the cleaning chamber and applying this hot fluid to the precursor structure or to any of its layers to heat it. But, it should be noted that the heat applied at this stage is not applied for reaction and formation of the Group IBIIIAVIA compound layer. Heat applied during planarization is relatively low (<200° C.) and mainly helps the planarization process itself by softening the precursor structure or any of its layers. This heat is not adequate to convert the precursor structure or its layers into a solar cell grade Group IBIIIAVIA compound semiconductor. Such reaction step is carried out on the planarized precursor structure at a later stage of the overall process.

Referring back to FIG. 5, in this embodiment, the planarization apparatus is a pair of rollers 514A and 514B, rotated and moved by a driving means, such as a motor. The upper roller 514A planarizes the precursor structure 600A when its smooth surface is pressed against the precursor structure 600A. As the upper roller 514A is pressed against the precursor structure 600A, the lower roller 514B presses against and supports a back surface 504B of the continuous workpiece 502. The rollers 514A and 514B may be made of various materials, such as stainless steel, hard plastics, etc. The rollers may be heated during the planarization process. The system 500 may also have other process stations such as a reaction chamber 516 to react the already planarized precursor structure to transform it fully or partially to a Group IBIIIAVIA thin film absorber layer as described above.

In one embodiment, the system 500 may include another planarization means or auxiliary planarization means which may or may not be used with the rollers 514A and 514B. As mentioned above, one example of such planarization means may be a surface of a flexible sheet material pressed against the precursor structure 600A to planarize it. An implementation of this embodiment can be seen in FIG. 6A which shows a flat sheet 550A placed between the surface of the precursor structure 600A and the roller 514A. During the process, the flat sheet 550A is also moved in the direction of the motion of the workpiece 502 with the same speed, while the upper roller 514A is pressed on the flat sheet and rotated on it. In this embodiment, the flat sheet may be a continuous flat sheet which is supplied and moved by a roll to roll flat sheet mechanism 552A. During the planarization process, unused flat sheet is fed from a flat sheet supply spool 554 and the used flat sheet is taken up and wrapped around a flat sheet receiving spool 556.

As shown in FIG. 6B a flat sheet 550B may be shaped as an endless loop and moved by an endless loop mechanism 552B to planarize the precursor structure 600A. The flat sheet 550B is retained in place by a spindle 558 and the upper roller 514A and moves or rotates about them as they are rotated. There may be another optional flat sheet between the lower roller 514B and the back surface 504B of the continuous workpiece 502. This flat sheet contacting the back surface may be driven by one of the mechanisms shown in FIGS. 6A-6B.

FIG. 7 shows the planar absorber layer 600C formed after reacting the planarized type II precursor structure 425 shown in FIG. 4D or the planarized type I precursor structure 403 depicted in FIG. 4C. Since the precursor structures in both cases are planarized, they yield Group IBIIIAVIA compound films or layers that are compositionally as well as structurally uniform. High efficiency solar cells may be fabricated on such compound films. It should be noted that the reaction step comprises heating the planarized precursor structures to a temperature range of 400-600 C., preferably in the presence of a Group VIA material which may be in vapor form or it may be deposited over the planarized precursor structure before the step of heating, or it may be already a constituent of the planarized precursor structure before the step of heating (such as the case for planarized type II precursor structure). Reaction typically takes 5-120 minutes depending on the temperature used.

Although the present invention is described with respect to certain preferred embodiments, modifications thereto will be apparent to those skilled in the art.

I claim:

1. A method of forming a Group IBIIIAVIA compound layer for thin film solar cell fabrication, the method comprising:
   providing a base having a front surface and a back surface;
   depositing a precursor structure that comprises one layer over the front surface of the base, wherein the precursor structure includes at least one Group IB material, at least one Group IIIA material and at least one a Group VIA material;
   planarizing the one layer of the precursor structure by pressing a smooth surface onto the one layer of the precursor structure thus forming a planarized precursor structure; and
   reacting to form the Group IBIIIAVIA compound layer on the base, wherein the step of reacting comprises applying a heat in the range of 350-600° C. to the planarized precursor structure, wherein a Group VIA material is provided to the planarized precursor structure during the step of reacting.

2. The method of claim 1 wherein the Group VIA material is provided to the planarized precursor structure in gaseous form as the heat is applied.

3. The method of claim 1 wherein the Group VIA material is provided to the planarized precursor structure by depositing it in solid form over the planarized precursor structure before the heat is applied.

4. The method of claim 1 wherein the Group VIA material is provided to the planarized precursor structure by depositing it in solid form over the planarized precursor structure before the heat is applied and in gaseous form as the heat is applied.

5. A method of forming a Group IBIIIAVIA compound layer for thin film solar cell fabrication, the method comprising:
   providing a base having a front surface and a back surface;
   depositing a precursor structure that comprises two or more layers over the front surface of the base, wherein the precursor structure includes at least one Group IB material, at least one Group IIIA material and at least one a Group VIA material; and
   planarizing at least one of the two or more layers of the precursor structure by pressing a smooth surface onto the at least one of the two or more layers of the precursor structure thus forming a planarized precursor structure; and
   reacting to form the Group IBIIIAVIA compound layer on the base, wherein the step of reacting comprises applying a heat in the range of 350-600° C. to the planarized precursor structure.

6. The method of claim 5 further including providing a Group VIA material to the planarized precursor structure during the step of reacting.

7. The method of claim 6 wherein the Group VIA material is provided to the planarized precursor structure in gaseous form as the heat is applied.

8. The method of claim 6 wherein the step of depositing deposits one or more layers of Cu, one or more layers of In, one or more layers of Ga and one or more layers of Se.

9. The method of claim 8 wherein the step of planarizing is applied after the deposition of the one or more layers of Cu, one or more layers of In, one or more layers of Ga and one or more layers of Se.

10. The method of claim 8 wherein the step of depositing deposits one or more layers of Cu, one or more layers of In, one or more layers of Ga and one layer of Se, and the step of planarizing is applied before the deposition of the one layer of Se.

11. The method of claim 8 wherein the step of depositing comprises electrodeposition.

12. A method of forming a Group IBIIIAVIA compound layer for thin film solar cell fabrication, the method comprising:
   providing a base having a front surface and a back surface;
   depositing a precursor structure that comprises one layer over the front surface of the base, wherein the precursor structure includes at least one Group IB material and at least one Group IIIA material;
   planarizing the one layer of the precursor structure by pressing a smooth surface onto the one layer of the precursor structure thus forming a planarized precursor structure; and
   reacting to form the Group IBIHAVIA compound layer on the base, wherein the step of reacting comprises applying a heat in the range of 350-600° C. to the planarized precursor structure, wherein a Group VIA material is provided to the planarized precursor structure during the step of reacting.

13. The method of claim 12 wherein the Group VIA material is provided to the planarized precursor structure in gaseous form as the heat is applied.

14. The method of claim 12 wherein the Group VIA material is provided to the planarized precursor structure by depositing it in solid form over the planarized precursor structure before the heat is applied.

15. The method of claim 12 wherein the Group VIA material is provided to the planarized precursor structure by depositing it in solid form over the planarized precursor structure before the heat is applied and in gaseous form as the heat is applied.

16. The method of claim 12 wherein the precursor structure comprises two or more layers and the step of depositing deposits the two or more layers over the front surface of the base, and wherein the step of planarizing planarizes at least one of the two or more layers.

17. The method of claim 16 further including providing a Group VIA material to the planarized precursor structure during the step of reacting.

18. The method of claim 17 wherein the Group VIA material is provided to the planarized precursor structure in gaseous form as the heat is applied.

19. The method of claim 17 wherein the Group VIA material is provided to the planarized precursor structure by depositing it in solid form over the planarized precursor structure before the heat is applied.

20. The method of claim 17 wherein the Group VIA material is provided to the planarized precursor structure by depositing it in solid form over the planarized precursor structure before the heat is applied and in gaseous form as the heat is applied.

21. The method of claim 17 wherein the step of depositing deposits one or more layers of Cu, one or more layers of In and one or more layers of Ga.

22. The method of claim 16 wherein the step of planarizing is repeated after at least each of two of the two or more layers are deposited.

23. The method of claim 12 wherein the step of planarizing is applied after the deposition of the one or more layers of Cu, one or more layers of In and one or more layers of Ga.

24. The method of claim 23 wherein the step of depositing comprises electrodeposition.

25. The method of claim 12, wherein the step of depositing comprises electrodeposition.

26. The method of claim 12 wherein the base is a flexible base comprising a flexible foil substrate and a contact layer disposed on the flexible foil substrate, such that the front surface of the flexible base is a top surface of the contact layer and the back surface of the flexible base is the bottom surface of the flexible foil substrate.

27. The method of claim 26 wherein the smooth surface is a surface of an upper roller and the step of planarizing is carried out by placing the at least one layer of the precursor structure between the upper roller and a support structure and applying force to the at least one layer of the precursor structure as the upper roller is rotated and the base is moved between the upper roller and the support structure, wherein the support structure supports the back surface of the base.

28. The method of claim 26, wherein the smooth surface is a surface of a flat sheet and the step of planarizing is carried out by placing the flat sheet onto the at least one layer of the precursor structure and applying a force onto the flat sheet.

29. The method of claim 28 wherein the force is applied by a roller pushing against the flat sheet.

30. A method of forming a Group IBIIIAVIA compound layer for thin film solar cell fabrication, the method comprising:
providing a base having a front surface and a back surface;
depositing at least one layer of a precursor structure over the front surface of the base, wherein the precursor structure includes at least one of a Group IB material, a Group IIIA material and a Group VIA material;
planarizing the at least one layer of the precursor structure by pressing a smooth surface onto the at least one layer of the precursor structure thus forming a planarized precursor structure wherein, during the step of planarizing, heating the precursor structure to a temperature lower than or equal to 200° C.; and
reacting to form the Group IBIIIAVIA compound layer on the base, wherein the step of reacting comprises applying a heat in the range of 350-600° C. to the planarized precursor structure.

31. A method of forming a Group IBIIIAVIA compound layer for thin film solar cell fabrication, the method comprising:
providing a base having a front surface and a back surface;
depositing at least one layer of a precursor structure over the front surface of the base, wherein the precursor structure includes at least one of a Group IB material, a Group IIIA material and a Group VIA material; and
planarizing the at least one layer of the precursor structure by pressing a smooth surface onto the at least one layer of the precursor structure thus forming a planarized precursor structure,
wherein the base is a flexible base comprising a flexible foil substrate and a contact layer disposed on the flexible foil substrate, such that the front surface of the flexible base is a top surface of the contact layer and the back surface of the flexible base is the bottom surface of the flexible foil substrate,
wherein the smooth surface is a surface of an upper roller and the step of planarizing is carried out by placing the at least one layer of the precursor structure between the upper roller and a support structure and applying force to the at least one layer of the precursor structure as the upper roller is rotated and the base is moved between the upper roller and the support structure, wherein the support structure supports the back surface of the base, and
wherein the support structure is a bottom roller which is substantially aligned with the upper roller so that the step of planarizing is carried out by placing the at least one layer of the precursor structure between the upper roller and the bottom roller and applying force to the at least one layer of the precursor structure as the upper roller and the bottom roller are rotated and the base is moved between the upper roller and the bottom roller.

32. The method of claim 31 wherein the steps of providing the base, depositing and planarizing are carried out in a reel-to-reel fashion so that portions of the flexible base is fed to the step of depositing by a supply reel and the portions of the planarized precursor structure is received by a receiving reel.

33. The method of claim 32 wherein the step of depositing comprises electrodeposition.

34. A method of manufacturing precursor stacks used for solar cell absorber fabrication, the method comprising:
providing a flexible base having a front surface and a back surface;
coating a Group IIIA material layer over the front surface of the flexible base, wherein the Group IIIA material comprises one of Ga, In and Ga-In alloy;
planarizing the Group IIIA material layer by pressing a smooth surface over it thus forming a planarized Group IIIA material layer; and
depositing a Group VIA material layer on the planarized Group IIIA material layer.

35. The method of claim 34, further comprising heating the Group IIIA material layer to a temperature during the step of planarizing wherein the temperature is lower than or equal to 156° C.

36. The method of claim 34 wherein the smooth surface is a surface of a roller and the step of planarizing is carried out by applying force to the Group IIIA material layer as the roller is rotated and the flexible base is moved on a support.

37. The method of claim 34 further comprising forming a first layer comprising a Group IB material on the front surface of the flexible base before coating the Group IIIA material layer.

38. The method of claim 34 wherein the steps of coating, forming and depositing all comprise electrodeposition.

39. The method of claim 34 further comprising depositing a Group VIA material layer on the Group IIIA material layer before the step of planarizing and wherein the step of planarizing planarizes the Group IIIA material layer along with the Group VIA material layer by pressing a smooth surface on the Group VIA material layer.

40. The method of claim 39 wherein the steps of depositing, forming and coating all comprise electrodeposition.

41. The method of claim 34 wherein the step of coating and the step of forming comprise electrodeposition.

42. The method of claim 34, wherein the step of coating comprises electrodeposition.

* * * * *